(12) United States Patent
Park et al.

(10) Patent No.: US 11,521,849 B2
(45) Date of Patent: Dec. 6, 2022

(54) IN-SITU DEPOSITION PROCESS

(71) Applicant: Applied Materials, Inc., Santa Clara, CA (US)

(72) Inventors: Sang Wook Park, Santa Clara, CA (US); Sunil Srinivasan, San Jose, CA (US); Rajinder Dhindsa, Pleasanton, CA (US); Jonathan Sungehul Kim, Danville, CA (US); Lin Yu, Santa Clara, CA (US); Zhonghua Yao, Santa Clara, CA (US); Olivier Luere, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/391,219

(22) Filed: Apr. 22, 2019

(65) Prior Publication Data
US 2020/0027717 A1 Jan. 23, 2020

Related U.S. Application Data

(60) Provisional application No. 62/701,227, filed on Jul. 20, 2018.

(51) Int. Cl.
| | | |
|---|---|---|
| *H01L 21/02* | (2006.01) | |
| *H01L 21/033* | (2006.01) | |
| *C23C 16/455* | (2006.01) | |
| *C23C 16/40* | (2006.01) | |
| *C23C 16/34* | (2006.01) | |

(52) U.S. Cl.
CPC ........ *H01L 21/0228* (2013.01); *C23C 16/345* (2013.01); *C23C 16/401* (2013.01); *C23C 16/45536* (2013.01); *H01L 21/0217* (2013.01); *H01L 21/02164* (2013.01); *H01L 21/02274* (2013.01); *H01L 21/0332* (2013.01)

(58) Field of Classification Search
CPC .......... H01L 21/0228; H01L 21/02164; H01L 21/0217; H01L 21/02274; H01L 21/0332; H01L 21/02211; H01L 21/0337; C23C 16/345; C23C 16/401; C23C 16/45536
USPC ........................................................ 438/778
See application file for complete search history.

(56) References Cited

U.S. PATENT DOCUMENTS

| | | | | |
|---|---|---|---|---|
| 6,416,822 | B1 * | 7/2002 | Chiang | ............... C23C 16/0227 257/E21.171 |
| 6,428,859 | B1 * | 8/2002 | Chiang | ............. C23C 16/45525 427/123 |
| 6,825,134 | B2 * | 11/2004 | Law | ....................... C23C 16/402 257/E21.267 |
| 6,869,838 | B2 * | 3/2005 | Law | .................. H01L 29/66757 257/374 |

(Continued)

*Primary Examiner* — Duy T Nguyen
(74) *Attorney, Agent, or Firm* — Patterson + Sheridan, LLP

(57) ABSTRACT

Embodiments of the present disclosure provide methods and apparatus for forming a desired material layer on a substrate between, during, prior to or after a patterning process. In one embodiment, a method for forming a material layer on a substrate includes pulsing a first gas precursor onto a surface of a substrate, attaching a first element from the first gas precursor onto the surface of the substrate, maintaining a substrate temperature less than about 110 degrees Celsius, pulsing a second gas precursor onto the surface of the substrate, and attaching a second element from the second gas precursor to the first element on the surface of the substrate.

16 Claims, 7 Drawing Sheets

(56) References Cited

U.S. PATENT DOCUMENTS

| | | | |
|---|---|---|---|
| 7,084,076 B2* | 8/2006 | Park | C23C 16/402 |
| | | | 257/E21.261 |
| 7,871,678 B1* | 1/2011 | Greer | C23C 16/34 |
| | | | 118/23 |
| 8,053,372 B1* | 11/2011 | Greer | C23C 16/45523 |
| | | | 427/255.23 |
| 9,355,886 B2* | 5/2016 | Swaminathan | C23C 16/045 |
| 9,564,312 B2* | 2/2017 | Henri | H01L 21/0228 |
| 9,875,891 B2* | 1/2018 | Henri | H01L 21/0228 |
| 9,960,033 B1* | 5/2018 | Nozawa | H01L 21/02274 |
| 10,008,428 B2* | 6/2018 | Kang | H01L 21/0228 |
| 10,032,626 B2* | 7/2018 | Noda | C23C 16/452 |
| 10,056,497 B2* | 8/2018 | Tanaka | H01L 29/78648 |
| 10,283,348 B2* | 5/2019 | Wang | H01L 21/02164 |
| 10,727,058 B2* | 7/2020 | Vidyarthi | C23C 16/26 |
| 10,804,099 B2* | 10/2020 | Henri | C23C 16/52 |
| 2002/0197402 A1* | 12/2002 | Chiang | C23C 16/0227 |
| | | | 427/255.39 |
| 2003/0186561 A1* | 10/2003 | Law | C23C 16/402 |
| | | | 438/788 |
| 2003/0189232 A1* | 10/2003 | Law | H01L 29/66757 |
| | | | 257/359 |
| 2004/0180557 A1* | 9/2004 | Park | H01L 21/02216 |
| | | | 438/787 |
| 2011/0014795 A1* | 1/2011 | Lee | H01L 21/3185 |
| | | | 257/E21.293 |
| 2012/0263887 A1* | 10/2012 | Papasouliotis | C23C 16/45542 |
| | | | 427/569 |
| 2014/0134827 A1* | 5/2014 | Swaminathan | H01L 21/02126 |
| | | | 438/437 |
| 2015/0303058 A1 | 10/2015 | Kummel et al. | |
| 2016/0148800 A1* | 5/2016 | Henri | C23C 16/045 |
| | | | 438/485 |
| 2016/0308060 A1* | 10/2016 | Tanaka | H01L 29/7869 |
| 2017/0040159 A1 | 2/2017 | Kachian et al. | |
| 2017/0107614 A1* | 4/2017 | Lee | C23C 16/45551 |
| 2017/0117134 A1* | 4/2017 | Henri | H01L 21/0228 |
| 2017/0207082 A1* | 7/2017 | Wang | H01L 21/0228 |
| 2017/0287696 A1* | 10/2017 | Noda | C23C 16/455 |
| 2017/0316988 A1* | 11/2017 | Kang | H01L 21/02274 |
| 2018/0061628 A1* | 3/2018 | Ou | H01L 21/3065 |
| 2018/0138028 A1* | 5/2018 | Henri | H01L 21/0228 |
| 2018/0230591 A1* | 8/2018 | Jang | H01L 21/02222 |
| 2018/0233349 A1* | 8/2018 | Smith | C23C 16/02 |
| 2018/0374682 A1 | 12/2018 | Tanikawa et al. | |
| 2020/0027717 A1* | 1/2020 | Park | C23C 16/401 |
| 2020/0058503 A1* | 2/2020 | Vidyarthi | H01L 21/0337 |
| 2020/0373149 A1* | 11/2020 | Park | H01L 21/02164 |

* cited by examiner

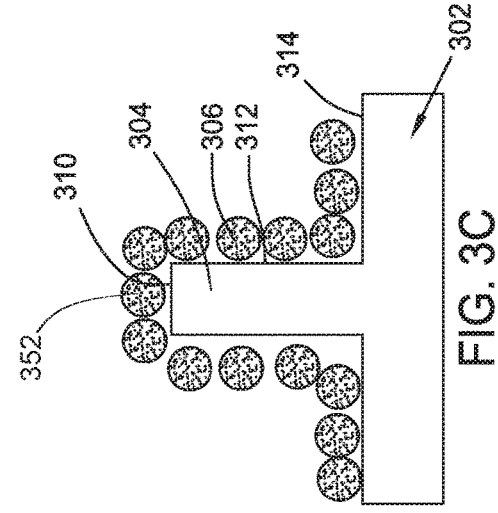
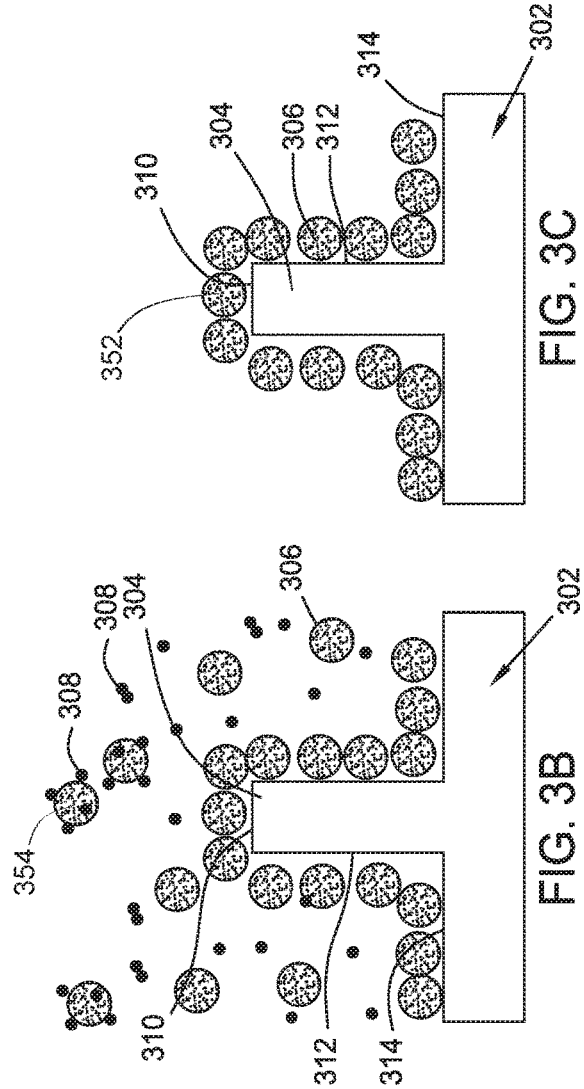
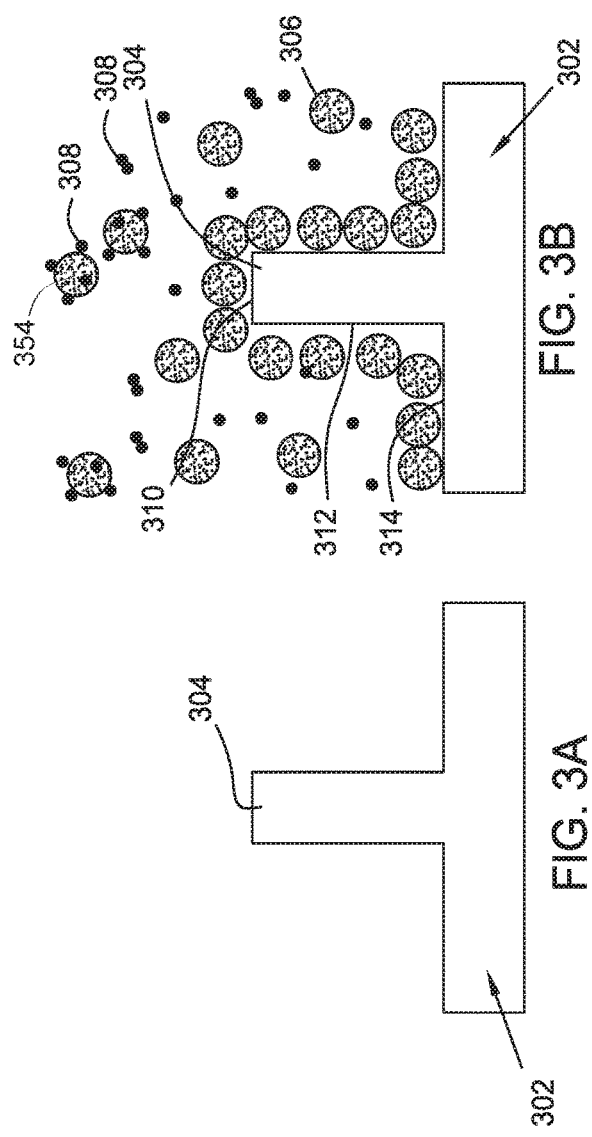
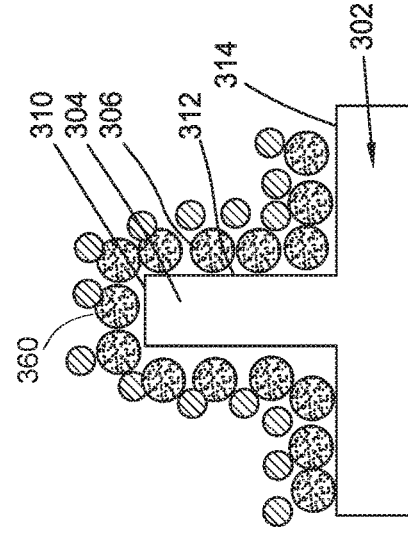
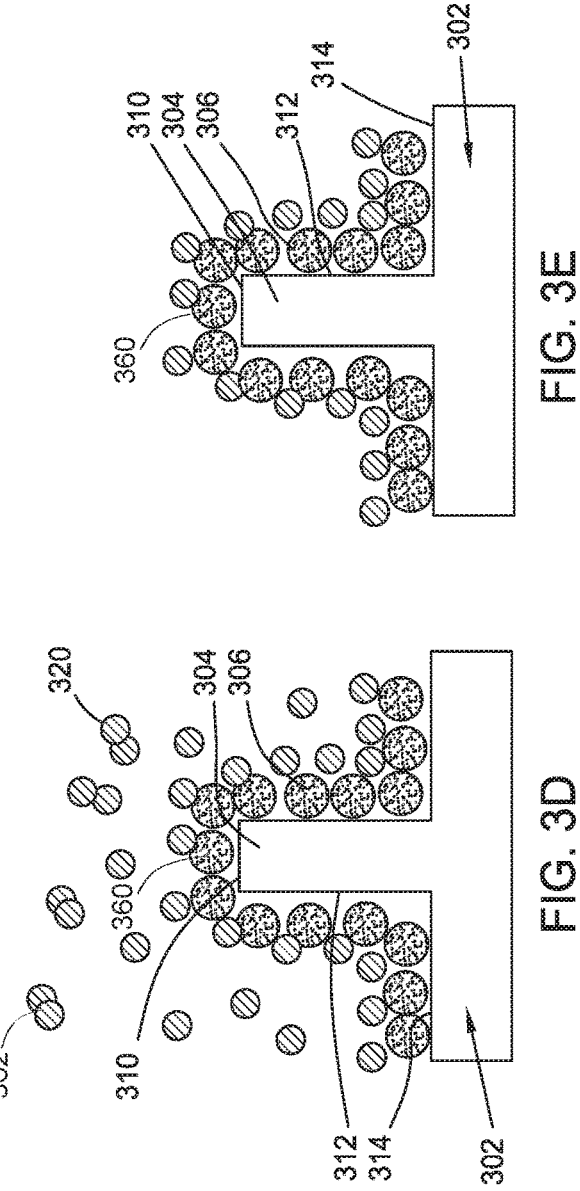

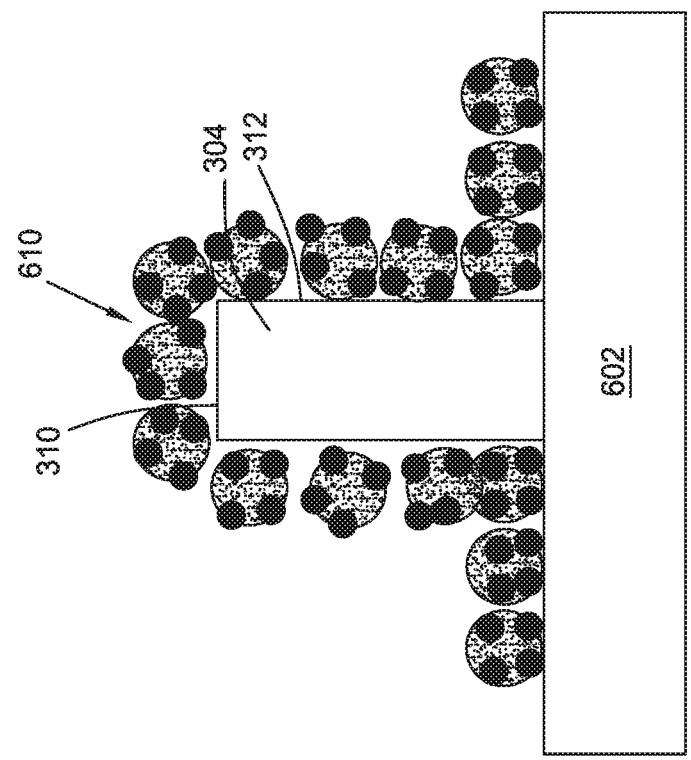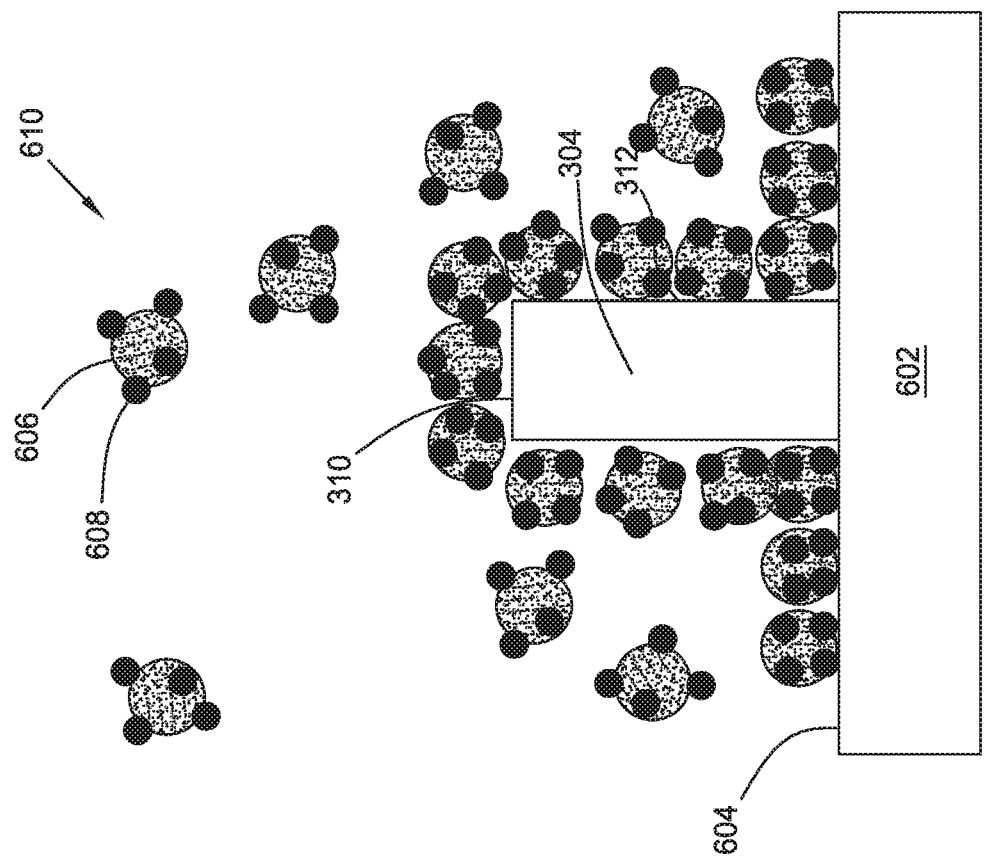

IN-SITU DEPOSITION PROCESS

CROSS-REFERENCE TO RELATED APPLICATIONS

This application claims benefit of U.S. Provisional Application Ser. No. 62/701,227 filed Jul. 20, 2018, which is incorporated by reference in its entirety.

BACKGROUND

Field

Examples of the present disclosure generally relate to a deposition process. Particularly, embodiments of the present disclosure provide methods for forming a material layer on a substrate using an in-situ deposition process in an etching chamber.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 100 masks is used to construct a chip and can be used repeatedly.

With the shrinking of critical dimensions (CD), present optical lithography is approaching a technological limit at the 45 nanometer (nm) technology node. Next generation lithography (NGL) is expected to replace the conventional optical lithography method, for example, in the 20 nm technology node and beyond. The images of the patterned mask are projected through the high-precision optical system onto the substrate surface, which is coated with a layer of photoresist. The patterns are then formed on the substrate surface after complex chemical reactions and follow-on manufacturing steps, such as development, post-exposure bake and wet or dry etching.

Multiple patterning technique is a technology developed for photolithography to enhance the feature density and accuracy. This technique is commonly used for patterns in the same layer which look different or have incompatible densities or pitches. Furthermore, between each patterning process, additional layers or structures may be formed, added or replenished in order to enable the next patterning process. Conventionally, the substrate is moved from the patterning or etching chamber to a deposition chamber. Thus, additional materials may be formed or replenished on the substrate in the deposition process in preparation of the subsequent patterning or etching process. However, transfer of the substrate between different processing chambers often increases likelihood of contamination on the substrate. Furthermore, transfer of the substrate between different processing chambers is often time-consuming, thus impacting the process throughput and cycle time.

Therefore, there is a need for an apparatus for performing a patterning process with a desired material or deposition replenishing mechanism during the patterning process.

SUMMARY

Embodiments of the present disclosure provide methods and apparatus for forming a desired material layer on a substrate between, during, prior to or after a patterning process. In one embodiment, a method for forming a material layer on a substrate includes pulsing a first gas precursor onto a surface of a substrate, attaching a first element from the first gas precursor onto the surface of the substrate, maintaining a substrate temperature less than about 110 degrees Celsius, pulsing a second gas precursor onto the surface of the substrate, and attaching a second element from the second gas precursor to the first element on the surface of the substrate.

In another embodiment, a method for forming a material layer on a substrate includes pulsing a first gas precursor comprising a first element to a substrate disposed in an etching processing chamber, pulsing a second gas precursor comprising a second element to the substrate disposed in the etching processing chamber, and forming a material layer on a surface of the substrate in the etching processing chamber, wherein the material layer comprising the first and the second elements.

In yet another embodiment, a method for forming a material layer on a substrate includes sequentially pulsing a first and a second gas precursor to a surface of a substrate disposed in an etching process chamber, and forming a first layer on a first location of a substrate and a second layer on a second location of a substrate.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

FIGS. 3A-3E illustrate cross sectional views of a substrate during the deposition process of FIG. 2;

FIGS. 6A-6D illustrate cross sectional views of a substrate during the deposition process of FIG. 5.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features and manufacturing nanostructures with desired small dimensions in a film stack are provided. The methods utilize a directional etching process to pattern material layers in the film stack layer at a desired angle, to laterally or directionally etch the material layers as needed. By doing so, an etching rate may be altered or modified while etching the features in the material layer in the film stack with different feature densities to improve etching selectivity and enhance feature transfer dimension and profile control.

The term "substrate" as used herein refers to a layer of material that serves as a basis for subsequent processing operations and includes a surface to be cleaned. For example, the substrate can include one or more material containing silicon containing materials, group IV or group III-V containing compounds, such as Si, polysilicon, amorphous silicon, Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Figure 1:
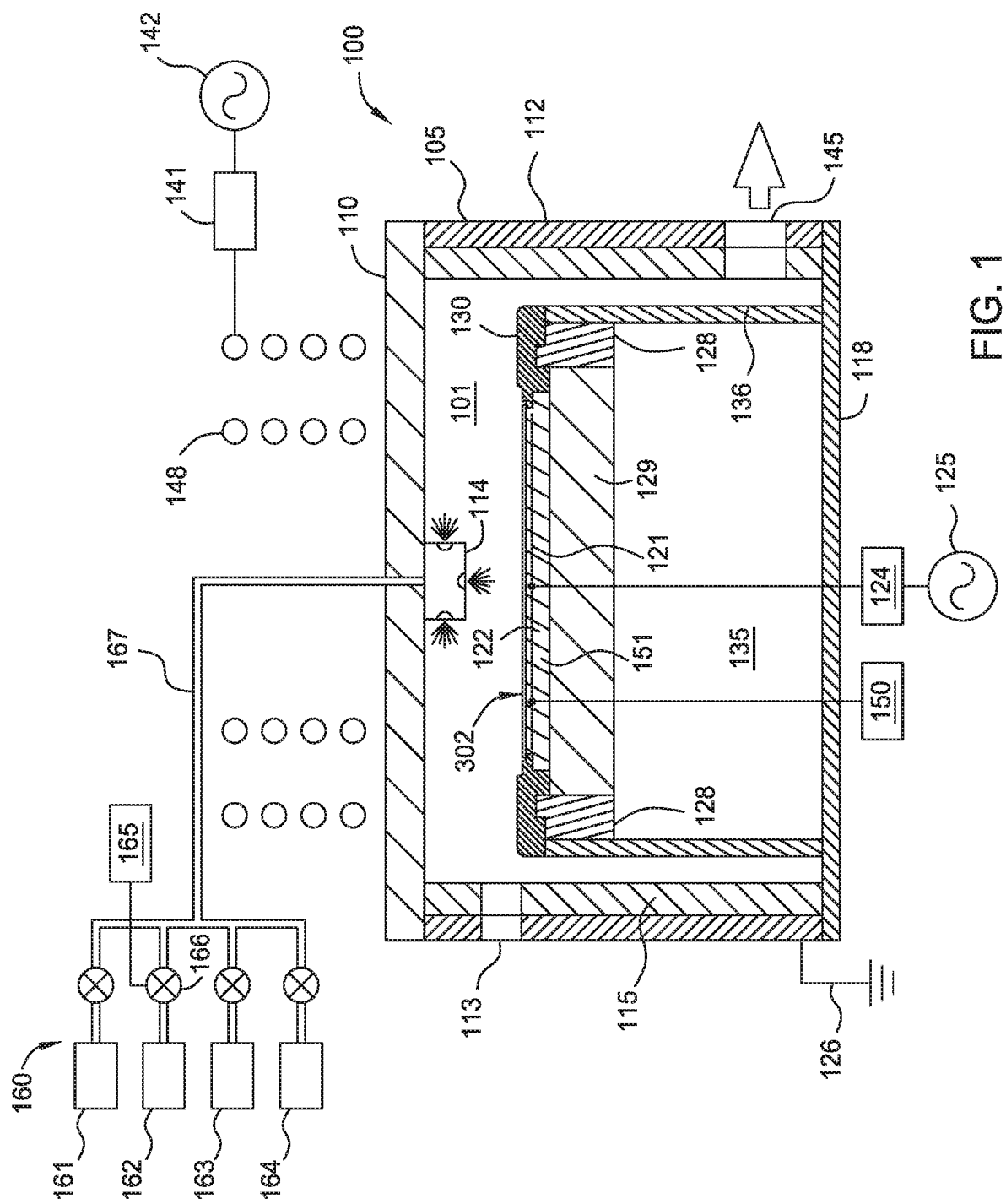
FIG. 1 is a schematic cross-sectional view of a processing chamber configured to perform a patterning process according to one or more embodiments of the disclosure.

FIG. 1 is a simplified cutaway view for an exemplary processing chamber 100 suitable for patterning a material layer disposed on a substrate 302 in the processing chamber 100. The exemplary processing chamber 100 is suitable for performing a patterning process. One example of the processing chamber 100 that may be adapted to benefit from the disclosure is an CENTRIS® Sym3™ etching processing chamber, available from Applied Materials, Inc., located in Santa Clara, Calif. It is contemplated that other process chambers, including those from other manufactures, may be adapted to practice embodiments of the disclosure.

The plasma processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and generally are proportionally larger than the size of the substrate 302 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 302 into and out of the plasma processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), silicon chloride ($SiCl_4$), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gasses may include nitrogen, chlorine, fluorine, oxygen and hydrogen containing gases such as $BCl_3$, $C_2F_4$, $C_4F_8$, $O_4F_6$, $CHF_3$, $CH_2F_2$, $CH_3F$, $NF_3$, $NH_3$, $CO_2$, $SO_2$, CO, $N_2$, $NO_2$, $N_2O$ and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the plasma processing chamber 100, the gases are energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 is disposed in the chamber volume 101 to support the substrate 302 during processing. The substrate support pedestal 135 may include an electrostatic chuck 122 for holding the substrate 302 during processing. The electrostatic chuck (ESC) 122 uses the electrostatic attraction to hold the substrate 302 to the substrate support pedestal 135. The ESC 122 is powered by an RF power supply 125 integrated with a match circuit 124.

The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 302 positioned thereon. The RF power supply 125 may cycle on and off, or pulse, during processing of the substrate 302. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 302.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 302 disposed thereon. The ESC 122 is configured to perform in the temperature range required by the thermal budget of the device being fabricated on the substrate 302. For example, the ESC 122 may be configured to maintain the substrate 302 at a temperature of about minus about 25 degrees Celsius to about 500 degrees Celsius for certain embodiments.

The cooling base 129 is provided to assist in controlling the temperature of the substrate 302. To mitigate process drift and time, the temperature of the substrate 302 may be maintained substantially constant by the cooling base 129 throughout the time the substrate 302 is in the cleaning chamber. In one embodiment, the temperature of the substrate 302 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 302, while shielding the top surface of the substrate support pedestal 135 from the plasma environment inside the plasma processing chamber 100. Lift pins (not shown) are selectively moved through the substrate support pedestal 135 to lift the substrate 302 above the substrate support pedestal 135 to facilitate access to the substrate 302 by a transfer robot (not shown) or other suitable transfer mechanism.

The controller 165 may be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2:
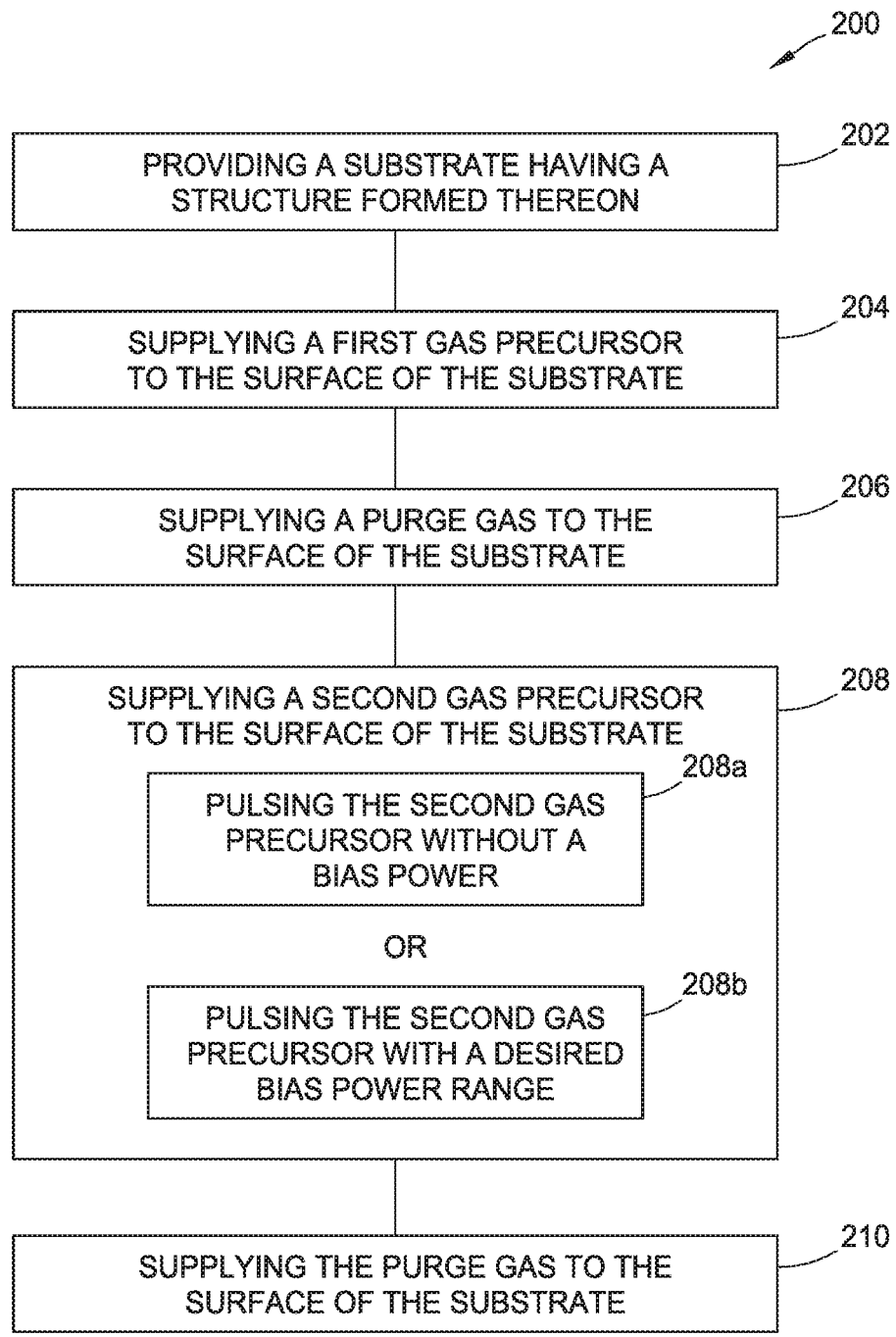
FIG. 2 is a flowchart of a method for performing a deposition process, according to one or more embodiments of the present disclosure.

FIG. 2 is a flow diagram of one example of a method 200 for in-situ deposition process for depositing a material layer on a substrate prior to, between or after a patterning process in an etching or patterning processing chamber. The material layer may be later utilized to serve as a mask layer, a spacer layer or a passivation layer to further alter dimensions or profiles of the features on the substrate for further feature transfer to the underlying layers disposed under the material layer. FIGS. 3A-3E and 4A-4B are cross-sectional views of a portion of a substrate 302 with a structure 304 formed thereon corresponding to various stages of the method 200. The method 200 may be utilized to deposit material layers onto structures 304 formed on the substrate 302 with different material requirements so as to form multiple mask layers, which may be utilized as an etching mask to form features into underlying layers formed on the substrate 302. Suitable materials for the underlying layers (not shown) may include an interlayer dielectric layer, contact dielectric layer, a gate electrode layer, a gate dielectric layer, a STI insulating layer, inter-metal layer (IML), or any suitable layers. Alternatively, the method 200 may be beneficially utilized to form materials on suitable types of structures as needed.

The method 200 begins at operation 202 by providing the substrate 302 having the structure 304 formed thereon. The substrate 302 is placed in a processing chamber, such as the processing chamber 100 depicted in FIG. 1 to perform a deposition process. In one example, the processing chamber 100 is an etching chamber or a patterning chamber that allows the substrate 302 to be disposed therein to perform a deposition process. The structure 304 includes patterned features formed in a desired distance away from each other. In one embodiment, the structure 304 may be fabricated from a dielectric layer or a photoresist layer utilized to form a layer in a semiconductor device. Suitable examples of the dielectric layer include carbon-containing silicon oxides (SiOC), polymer materials, such as polyamides, SOG, USG, silicon oxide, silicon nitride, silicon oxynitride, silicon carbide, silicon oxycarbide, or the like.

In the example wherein the structure 304 includes a photoresist layer, the photoresist layer may be utilized for extreme ultraviolet (EUV) applications as needed. The patterned photoresist layer may be an organic resist layer. In the example wherein the structure 304 includes a dielectric layer, the dielectric layer may be a silicon oxide, silicon nitride, silicon oxynitride (SiON), silicon oxycarbide (SiOC), or amorphous carbon materials as needed.

At operation 204, a first gas precursor 354 is supplied into the processing chamber 100 into the surface of the substrate 302, as shown in FIG. 3B. In one example, the first gas precursor 354 includes a first element, which may have high absorption to the substrate 302 as well as to the structure 304. For example, when the substrate 302 and/or the structure 304 includes atoms or elements that are the same as the atoms or elements in the first gas precursor 354, the atoms or elements from the first gas precursor 354 may be successfully adhered, absorbed or attached to the atoms or elements from the substrate 302 and/or from the structure 304 to enhance the attachment and bonding therebetween. For example, when the substrate 302 and/or the structure 304 include silicon elements, the first element from the first gas precursor 354 as selected here also includes a silicon element so that the silicon element from the first gas precursor 354 may be successfully adhered, absorbed or attached to the silicon elements from the substrate 302 and/or the structure 304. Suitable examples of the first gas precursor 354 is a silicon containing gas, such as $SiCl_4$, $SiH_4$, $Si_2Cl_6$, $SiF_4$, disilane ($Si_2H_6$), trisilane ($Si_3H_6$), tetrasilane ($Si_4H_{10}$), methyl silane ($SiCH_6$), dimethylsilane ($SiC_2H_6$), and the like, and the silicon elements is served as the first element from the first gas precursor 354 to be absorbed onto the surfaces of the substrate 302 and/or the structure 304.

The first gas precursor 354 is pulsed into the processing chamber 100 to perform an ALD-like process. For example, each pulse of an ALD process enables the growth and deposition of a monolayer of a material layer. The atomic layer deposition (ALD) process is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles, which are included in operation 204 and 208 in method 200 described herein. The thickness of the material layer formed by the ALD process depends on the number of reaction cycles. The first gas precursor pulse lasts for a predetermined time interval. The term pulse as used herein refers to a dose of material injected into the process chamber.

The first reaction form the first gas precursor 354 at operation 204 provides a first atomic layer of molecular layer (e.g., sourced from the first element from the first gas precursor) being absorbed on the substrate and a second reaction of a second element from a second gas precursor, which will be described later at operation 208, provides a second atomic layer of molecular layer being absorbed on the first atomic and/or mono layer. In the example depicted in FIG. 3B, the first gas precursor 354 includes two elements, such as silicon elements 306 and chlorine elements 308, when the first gas precursor 354 is $SiCl_4$. The silicon elements 306 is absorbed and adhered onto the top surface 310 and sidewalls 312 of the structure 304 as well as an upper surface 314 of the substrate 302, which also have silicon elements. The chlorine elements 308, which does not share the same elements from the substrate 302 and/or the structure 304, is then dangling adjacent to the structure 304, with loose bonds or no bonds, to the structure 304 and/or the substrate 302.

Several process parameters are also regulated during pulsing of the first gas precursor. In one embodiment, the process pressure is controlled at between about 1 mTorr and about 100 mTorr. The processing temperature is maintained at less than about 110 degrees Celsius, such as between about −10 degrees Celsius and about 120 degrees Celsius, such as between about 20 degrees Celsius and about 100 degrees Celsius. The RF source power may be controlled at between about 100 watts and about 2500 watts, such as between about 500 watts and about 1000 watts. The RF bias power may be controlled at between about 10 watts and about 500 watts, such as between about 50 watts and about 100 watts. The first gas precursor may be supplied at between about 5 sccm and about 150 sccm. Each pulse of the first precursor gas may deposit the first monolayer of the material layer 360 having a thickness between about 3 Å and about 5 Å.

At operation 206, a purge gas is then supplied to the processing chamber 100 to purge out the atoms and/or elements (e.g., the chlorine elements 308) not attached to the substrate 302 and/or the structure 304, as shown in FIG. 3C. Suitable examples of the purge gas include an insert gas, such as Ar or He, a nitrogen containing gas, or other suitable gases.

Several process parameters are also regulated during pulsing of the purge gas mixture. In one embodiment, the process pressure is controlled at between about 1 mTorr and about 100 mTorr. The processing temperature is maintained at less than about 110 degrees Celsius, such as between about −10 degrees Celsius and about 110 degrees Celsius, such as between about 20 degrees Celsius and about 100 degrees Celsius. The RF source power may be controlled at between about 100 watts and about 1200 watts, such as between about 500 watts and about 1000 watts. The RF bias power may be controlled at between about 10 watts and about 200 watts, such as between about 50 watts and about 100 watts. The purge gas may be supplied at between about 5 sccm and about 150 sccm.

At operation 208, a second gas precursor 362 is supplied into the processing chamber 100 into the surface of the substrate 302, as shown in FIG. 3D. In one example, the second gas precursor 362 includes a second element which can react with the first element, such as the silicon element 306, on the substrate 302 and/or the structure 304 provided from the first gas precursor. The second element as pulsed reacts and bonds with the first element, such as the silicon element 306 on the surfaces 310, 314 and the sidewall 312 of the substrate 302 and/or the structure 304. In the example disposed in FIG. 3D, the second gas precursor 362 includes an oxygen or a nitrogen containing gas, providing an oxygen or a nitrogen element 320. It is noted that other suitable second gas precursor 362 that is capable of providing elements or atoms to react with the elements from the first gas precursor may also be utilized as needed. The oxygen or nitrogen element 320 reacts with the silicon element 306. The oxygen or nitrogen element 320 is then absorbed by the silicon element 306 on the substrate 302 and/or the structure 304, forming a material layer 360 on the surfaces 314, 310 and the sidewall 312 of the substrate 302 and/or the structure 304. In the example wherein the second element is an oxygen element 320, the material layer 360 as formed on the substrate 302 is a silicon oxide layer. In another example wherein the second element is a nitrogen element 320, the material layer 360 as formed on the substrate 302 is a silicon nitride layer.

Suitable examples of the oxygen containing gas include $O_2$, $CO_2$, $H_2O$ and the like. Suitable examples of the nitrogen containing gas include $N_2$, $NO_2$, $N_2O$, $NH_3$, and the like. In one example, the oxygen containing gas is $O_2$ and the nitrogen containing gas is $NH_3$.

Based on different process requirements, process parameters may be controlled differently at operation 208. In the example wherein the material layer 360 is desired to be formed conformally across the substrate 302 and/or structure 304, as shown in FIGS. 3D and 3E, a suitable range of RF bias power may be applied to provide directionality of the elements or atoms toward the surfaces 314, 310 and the sidewall 312 of the substrate 302 and/or the structure 304, as indicated at operation 208b. With the assistance from the RF bias power, the elements or atoms from the second gas precursor may stay on the top surface of the structure 304 as well as accelerated toward the sidewall 312 of the structure 304 and the top surface 310 of the substrate 302.

Figure 4B:
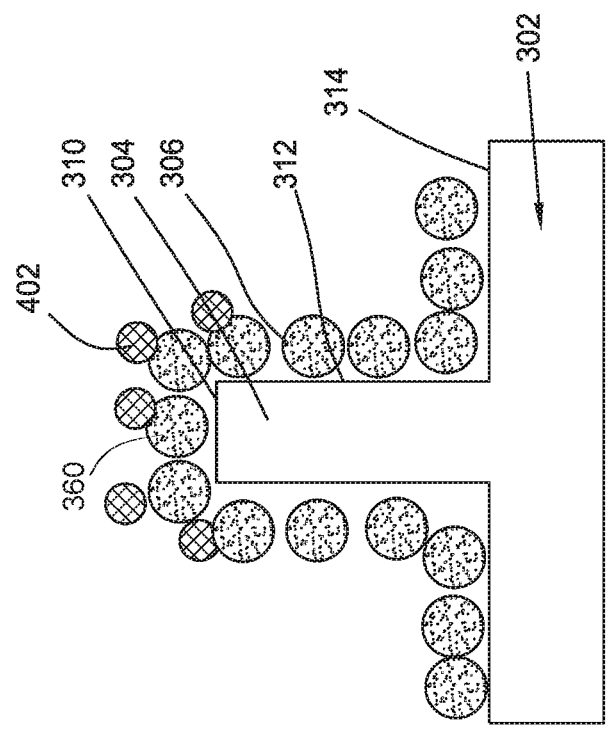
FIGS. 4A-4B illustrate cross sectional views of a substrate during the deposition process of FIG. 2.
Figure 4A:
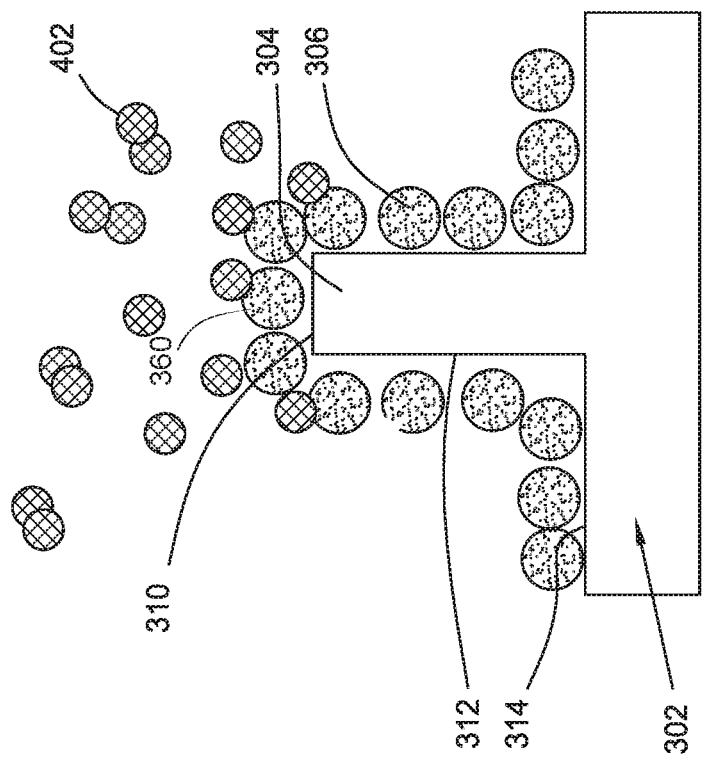

In contrast, in the example wherein the material layer 360 is desired to be formed selectively on the top surface 310 of the structure 304, as shown in FIGS. 4A and 4B, the supply of RF bias power may be eliminated so that the second element 402 is relatively floated and widely distributed close to the top surface 310 of the structure 304, as indicated at operation 208a. As the second element 402 is bonded with first element 306 by surface absorption (e.g., the ALD-like process), when the second element 402 from the second gas precursor is pulsed to the substrate surface, the second element 402 then first meets with the first element 306 located at the top surface 310 of the structure 304, predominately forming the material layer 360 on the top surface 310 of the structure 304. Thus, by controlling the supply of the RF bias power during operation 208, the material layer 360 may be formed at different locations of the substrate 302 and the structure 304.

Several process parameters are also regulated during pulsing of the second gas precursor 362. In one embodiment, the process pressure is controlled at between about 1 mTorr and about 100 mTorr. The processing temperature is maintained at less than about 110 degrees Celsius, such as between about −10 degrees Celsius and about 110 degrees Celsius, such as between about 20 degrees Celsius and about 100 degrees Celsius. The RF source power may be controlled at between about 100 watts and about 2500 watts, such as about 500 watts and about 1000 watts. The RF bias power may be optionally supplied while supplying the second gas precursor. At operation 208a to form the material layer 360 predominately on the top surface 310 of the structure 304, as shown in FIGS. 4A-4B, the RF bias power may be eliminated. In contrast, in operation 208b to form the material layer 360 conformally across the substrate 302 and the structure 304 on the substrate 302, as shown in FIGS. 3D-3E, the RF bias power may be controlled at between about 10 watts and about 500 watts, such as between about 50 watts and about 100 watts. The second gas precursor may be supplied at between about 5 sccm and about 150 sccm. Each pulse of the second precursor gas may deposit the first monolayer of the material layer 360 having a thickness between about 3 Å and about 15 Å.

At operation 210, a purge gas is then supplied to the processing chamber 100 to purge out the atoms and/or elements not attached to the substrate 302 and/or the structure 304, as shown in FIGS. 3E and 4B, similar to the purge gas supply at operation 206. Suitable examples of the purge gas include an insert gas, such as Ar or He, a nitrogen containing gas, or other suitable gases.

Several process parameters are also regulated during pulsing of the purge gas mixture. In one embodiment, the process pressure is controlled at between about 1 mTorr and about 100 mTorr. The processing temperature is maintained at less than about 110 degrees Celsius, such as between about −10 degrees Celsius and about 120 degrees Celsius, such as between about 20 degrees Celsius and about 100 degrees Celsius. The RF source power may be controlled at between about 100 watts and about 2500 watts, such as between about 500 watts and about 1000 watts. The RF bias power may be controlled at between about 10 watts and about 500 watts, such as between about 50 watts and about 100 watts. The purge gas may be supplied at between about 5 sccm and about 150 sccm.

As such, the ordered structure of the monolayers composed from the first elements and the second elements from the operation 204 and 208 is then formed on the structured material layer 360 at desired locations of the substrate 302. The first monolayer from the first gas precursor 354 at operation 204 is absorbed onto the desired locations of the substrate 302 and the structure 304 by a chemical reaction that allows the atoms from the first monolayer to be securely adhered on the atoms the substrate 302 and the structure 304. The subsequently formed second monolayer from the second gas precursor 362 at operation 208 is then selectively formed at different locations of the substrate 302 and the structure 304, based on the control of the RF bias power during operation 208, thus enabling a deposition of an ALD process.

Between each pulse of the first gas precursor 354 or the second gas precursor 362 at operation 204 and 208, the purge gas at operation 206 may be pulsed into the processing chamber in between each or multiple pulses of the first and/or second gas precursors 354, 362 to remove the impurities or residual precursor gas mixture which is unreacted/non-absorbed by the substrate surface (e.g., unreacted impurities from the reactant gas mixture or others) so they can be pumped out of the processing chamber.

It is noted that additional cycles starting from the pulsing of the first gas precursor 354 at operation 204, the purge gas supply at operation 206 and the second gas precursor 362 at operation 208 can then be repeatedly performed until a desired thickness of the material layer 360 is obtained. When a subsequent cycle of pulsing the first gas precursor 354 starts, the process pressure and other process parameters may be regulated to the predetermined level to assist depositing a subsequent monolayer of the material layer 360.

Figure 5:
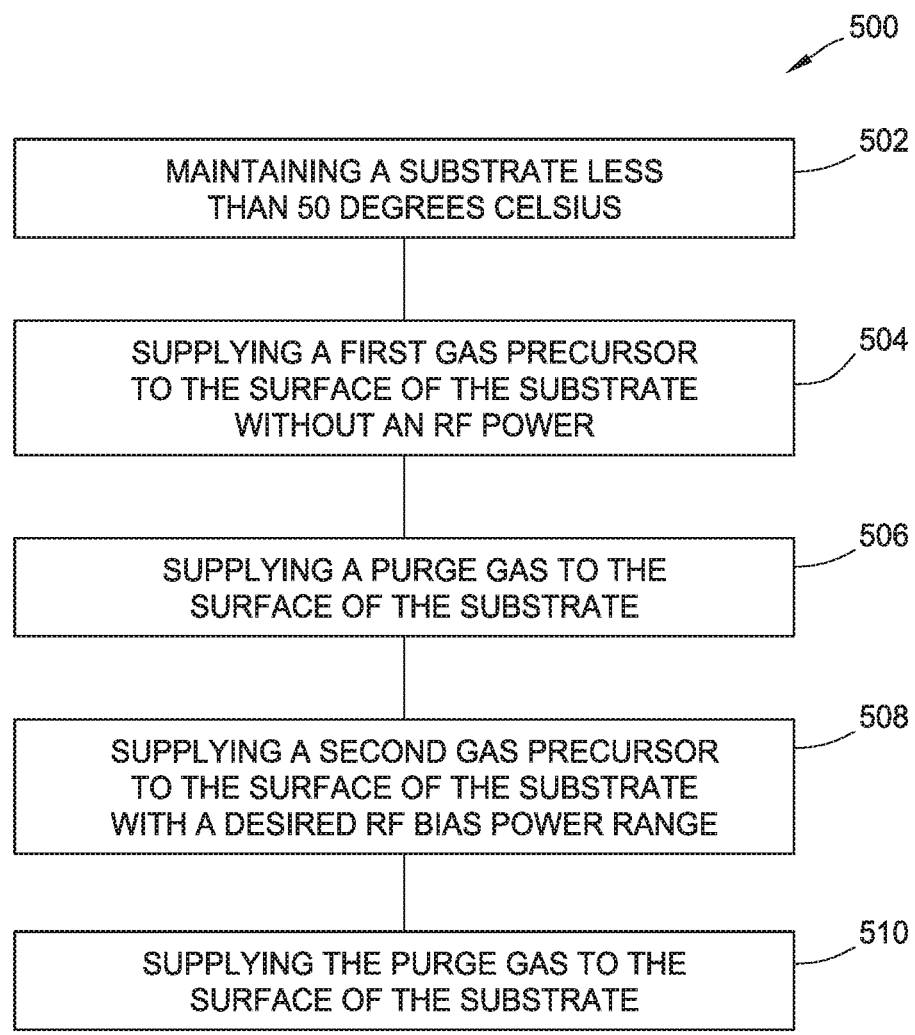
FIG. 5 is a flowchart of another example of a method for performing a deposition process, according to one or more embodiments of the present disclosure.

FIG. 5 is a flow diagram of another example of a method 500 for in-situ deposition process for depositing a material layer on a substrate prior to or after a patterning process in an etching or patterning processing chamber. The material layer may be later utilized to serve as a mask layer, a spacer layer or a passivation layer to further alter dimensions or profiles of the features on the substrate for further feature transfer to the underlying layers disposed under the material layer. FIGS. 6A-6D are cross-sectional views of a portion of a substrate 602 with the structure 304 formed thereon corresponding to various stages of the method 500. The substrate 602 may be similar to the substrate 302 described above. In a specific example, the substrate 602 includes a polysilicon material.

The method 500 begins at operation 502 by providing the substrate 602 having the structure 304 formed thereon. The substrate 602 is placed on the ESC 122 in the processing chamber 100 depicted in FIG. 1 to perform a deposition process. In this particular example, the ESC 122 temperature is controlled at less than about 50 degrees Celsius so as to control the substrate 602 disposed thereon also at the temperature range less than about 50 degrees Celsius. In one example, the temperature range is controlled at between about −20 degrees Celsius and about 50 degrees Celsius, such as between about −10 degrees Celsius and about 40 degrees Celsius, for example about 20 degrees Celsius.

At operation 504, the first gas precursor 610, similar to or the same as the first gas precursor 354 at operation 204, is supplied to the surface 604, 310 of the substrate 602 and the structure 304. Similar to the operation 204, the first precursor 610 includes the first element 606 that can successfully bond with and attach to the substrate 602 as well as the structure 304. In contrast to the process at operation 204, the RF source and/or bias power supplied at operation 504 are eliminated. In other words, the first element 606 and the other element 608 from the compound of the first gas precursor 610 are not dissociated by the RF source or bias power. Thus, the compound (e.g., the whole molecule) from the first gas precursor 610 is precipitated, absorbed and fallen on the surface 604, 310 and sidewall 312 the substrate 602 and the structure 304, as shown in FIG. 6A. The first gas precursor 610 at operation 504 is the same or similar to the first gas precursor 354 supplied at operation 204. In one example, the first gas precursor at operation 504 is $SiCl_4$.

At operation 506, similar to the operation 206, a purge gas is supplied to purge out the unreacted and/or unabsorbed first gas precursor 610, as shown in FIG. 6B. The operation 506 is similar to or the same as the operation 206 described above.

At operation 508, similar to the operation 208, particularly similar to the operation 208a, the second precursor 614 is supplied to the surface 604, 310 of the substrate 602 and the structure 304 without applying a RF bias power. Thus, the RF source power supplied at operation 508 dissociates the second gas precursor 614 as well as the molecule absorbed on the substrate 602 from the first gas precursor 610, as shown in FIG. 6C. The other element 608 is then dissociated from the first element 606 absorbed on the substrate surface. The second element 612 supplied from the second gas precursor 614 is then absorbed on the first element 606 disposed on the surface 310 the structure 304, forming a material layer 650. Similar to the operation 208, at least one element (e.g., the second element 612) from the second gas precursor 614 at operation 508 is selected to have high absorption to the first element 606 from the first gas precursor 610 absorbed on the substrate surface. In one example, the second gas precursor 614 at operation 508 is NH$_3$ or N$_2$, when the material layer 650 to be formed is described to be a SiN layer, or O$_2$, when the material layer 650 to be formed is described to be a SiO$_2$ layer.

The RF bias power may or may not be applied while supplying the second gas precursor 614. In the example depicted in FIG. 6C, the RF source power is applied without the RF bias power. Thus, the second elements 612 dissociated from the second gas precursor 614 are predominately located on the top surface 310 of the structure 304.

Figure 6D:
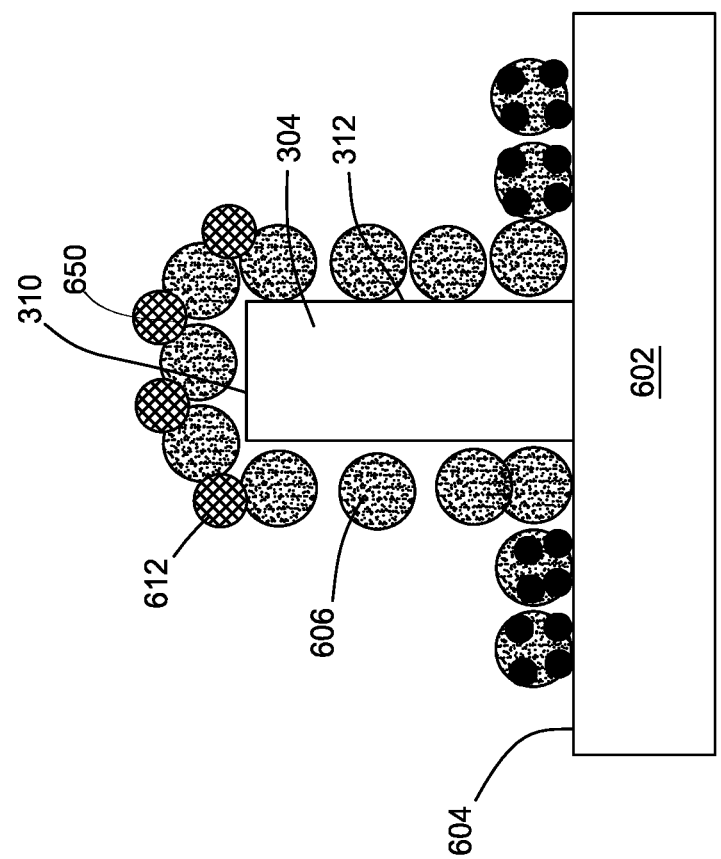
Figure 6C:
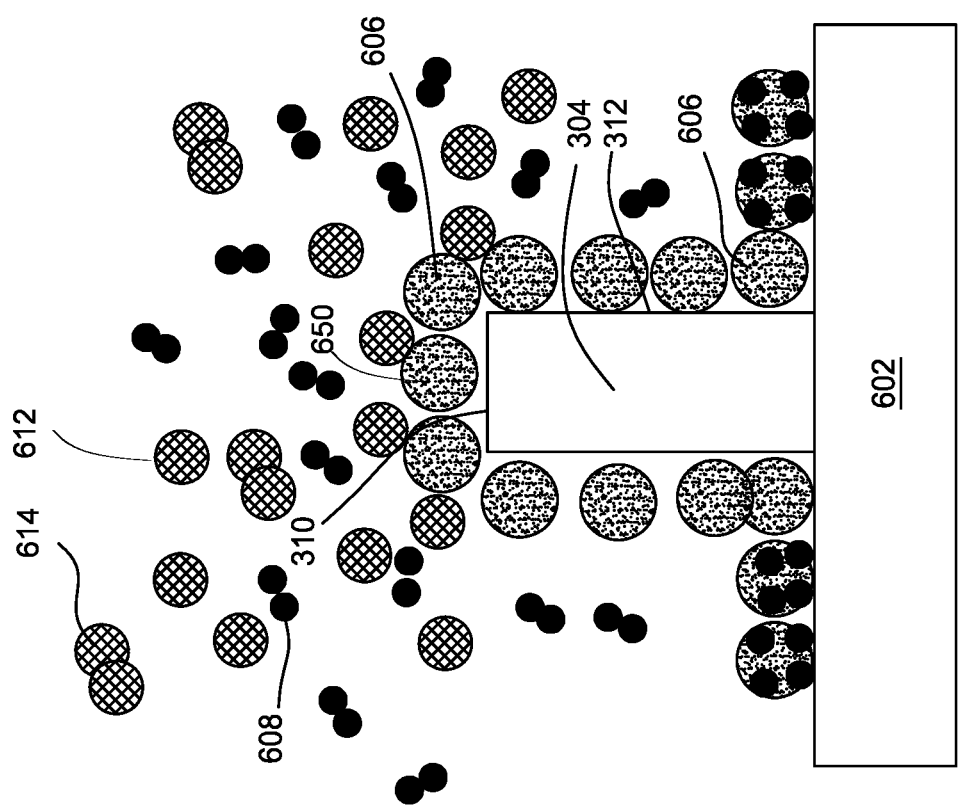

At operation 510, after the second element 612 is successfully attached, absorbed to or bonded with the first element 606, similar to the operation 210, a purge gas is supplied to purge out the unreacted and/or unabsorbed first and second gas precursor 610, 614, as shown in FIG. 6D. The operation 510 is similar to or the same as the operation 210 described above. In this example, the top surface 604 of the substrate 602 has the compound (e.g., the whole molecule including the first element 606 and the other element 608) from the first gas precursor 610 while the top surface 310 of the structure 304 has the material layer 650 (including the first element 606 and the second element 612) formed thereon. In some examples, the sidewalls 312 of the structure 304 may include the first element 606 from the first gas precursor 610 as needed. Thus, in this example, the layers formed on the top surface 604 of the substrate 602 is then different from the layers formed on the top surface 310 of the structure 304 and/or formed on the sidewalls 312 of the structure 304.

Between each pulse of the first gas precursor 610 or the second gas precursor 614 at operation 504 and 508, the purge gas at operation 506 may be pulsed into the processing chamber in between each or multiple pulses of the first and/or second gas precursors to remove the impurities or residual precursor gas mixture which is unreacted/non-absorbed by the substrate surface (e.g., unreacted impurities from the reactant gas mixture or others) so they can be pumped out of the processing chamber.

It is noted that additional cycles starting from the pulsing of the first gas precursor 610 at operation 504, the purge gas supply at operation 506 and the second gas precursor 614 at operation 508 can then be repeatedly performed until a desired thickness of the material layer 650 is obtained. When a subsequent cycle of pulsing the first reactant gas mixture starts, the process pressure and other process parameters may be regulated to the predetermined level to assist depositing a subsequent monolayer of the material layer 650.

Thus, deposition methods for forming a material layer on a structure of a substrate are provided. The deposition methods utilize an ALD like deposition process to form the material layer in an etching processing chamber so that an etching process may immediately follow after the deposition process of the material layer. Thus, process cycle time and manufacturing throughput may be improved and well managed.

While the foregoing is directed to embodiments of the present disclosure, other and further embodiments of the disclosure may be devised without departing from the basic scope thereof, and the scope thereof is determined by the claims that follow.

We claim:

1. A method for forming a material layer on a substrate, comprising:
   (a) pulsing a first gas precursor onto a surface of the substrate;
   (b) attaching a first element from the first gas precursor onto the surface of the substrate wherein the surface of the substrate already contained the first element prior to pulsing the first gas precursor;
   (c) supplying a purge gas between pulsing of the first and a second gas precursor;
   (d) pulsing the second gas precursor onto the surface of the substrate and striking a plasma with a RF source power of between about 100 watts and about 2500 watts;
   (e) attaching a second element from the second gas precursor to the first element on the surface of the substrate;
   (f) selectively forming the material layer on a surface of a structure on the substrate; and
   (g) maintaining the substrate at a temperature less than about 110 degrees Celsius throughout a-f.

2. The method of claim 1, wherein pulsing the first gas precursor further comprises:
   applying a RF source power while supplying the first gas precursor.

3. The method of claim 1, wherein the substrate is placed in an etching processing chamber.

4. The method of claim 1, wherein the first gas precursor is pulsed to the surface of the substrate without applying a RF source or bias power.

5. The method of claim 4, wherein the temperature is maintained between about −20 degrees Celsius and about 50 degrees Celsius while pulsing the first gas precursor without applying the RF bias power.

6. The method of claim 1, wherein the second gas precursor is pulsed to the surface of the substrate by cycling the RF bias power on and off.

7. The method of claim 1, wherein pulsing the second gas precursor further comprises:
   applying a RF source power and a RF bias power while supplying the second gas precursor.

8. The method of claim 1, wherein the first gas precursor comprises a silicon containing gas.

9. The method of claim 8, wherein the silicon containing gas is SiCl$_4$.

10. The method of claim 1, wherein the second gas precursor comprises a nitrogen or oxygen containing gas.

11. The method of claim 8, wherein the second gas precursor is N$_2$ or O$_2$.

12. The method of claim 1, further comprising:
   selectively forming a first material layer on a top surface of a structure on the substrate while forming a second material layer on a top surface of the substrate.

13. A method for forming a material layer on a substrate comprising:
   (a) pulsing a first gas precursor comprising a first element to a substrate disposed in an etching processing chamber, wherein the substrate already contained the first element prior to pulsing the first gas precursor;

(b) supplying a purge gas between pulsing of the first and a second gas precursor;

(c) pulsing the second gas precursor comprising a second element and striking a plasma with a RF source power of between about 100 watts and about 2500 watts; and wherein the second element from the second gas precursor attaches to the first element on the surface of the substrate disposed in the etching processing chamber;

forming the material layer on a surface of the substrate in the etching processing chamber, wherein the material layer comprises the first and the second elements; and maintaining the substrate at a temperature less than about 110 degrees Celsius throughout a-c.

14. The method of claim 13, wherein the first gas precursor is pulsed into the etching processing chamber without applying a RF source or bias power in the etching processing chamber.

15. The method of claim 13, wherein the second gas precursor is pulsed into the etching processing chamber by cycling the RF bias power on and off in the etching processing chamber.

16. A method for forming a material layer on a substrate comprising:

sequentially pulsing a first and a second gas precursor to a surface of the substrate disposed in an etching process chamber wherein a purge gas is supplied between pulsing of the first and the second gas precursor while maintaining the substrate at a temperature of less than about 110 degrees Celsius, striking a plasma with a RF source power of between about 100 watts and about 2500 watts while maintaining the substrate at the temperature of less than about 110 degrees Celsius; and forming a first layer with the first precursor gas on a first location of the substrate and a second layer with the second precursor gas on a second location of the substrate while maintaining the substrate at the temperature of less than about 110 degrees Celsius.

* * * * *